United States Patent [19]

Leichle

[11] 4,233,592

[45] Nov. 11, 1980

[54] METHOD FOR DETECTION OF THE ANGULAR POSITION OF A PART DRIVEN IN ROTATION AND INSTRUMENTATION USING IT

[75] Inventor: Claude Leichlé, Le Pecq, France

[73] Assignee: Regie Nationale des Usines Renault, Boulogne-Billancourt, France

[21] Appl. No.: 966,217

[22] Filed: Dec. 4, 1978

[30] Foreign Application Priority Data

Dec. 2, 1977 [FR] France ................................ 77 36283

[51] Int. Cl.$^2$ ............................................ H03K 13/02

[52] U.S. Cl. ........................... 340/347 P; 235/92 MP; 250/231 SE; 340/347 M

[58] Field of Search ....................... 340/347 M, 347 P; 250/231 SE, 560; 324/175; 328/63; 235/92 MP

[56] References Cited

U.S. PATENT DOCUMENTS

| | | | |
|---|---|---|---|
| 3,262,105 | 7/1966 | Bell | 340/347 M X |
| 3,930,201 | 12/1975 | Ackermann et al. | 340/195 X |

FOREIGN PATENT DOCUMENTS 2044714 2/1971 France .

*Primary Examiner*—Thomas J. Sloyan
*Attorney, Agent, or Firm*—Oblon, Fisher, Spivak, McClelland & Maier

[57] ABSTRACT

A shaft, the angular position of which is to be detected, equipped with a notched disk one tooth of which has been removed. A position sensor detects the passage of the teeth for a Schmitt trigger with its output connected to the inputs of two monostable multivibrators, to the up-down counter input of a counter, to one input of an AND gate and to the inputs of logic circuits. The held output of the counter is connected to an input of a type D flip-flop connected at its output to the second input of the AND gate.

9 Claims, 12 Drawing Figures

METHOD FOR DETECTION OF THE ANGULAR POSITION OF A PART DRIVEN IN ROTATION AND INSTRUMENTATION USING IT

BACKGROUND OF THE INVENTION

The present invention relates in general to a method for detecting the angular position of a moving part, and in particular to an associated method of decoding.

The detection of the angular position of a rotating part requires two pieces of information: one, which is called incremental location, is constituted by incremental detection of a series of regularly spaced notches indicating elemental angles $d\alpha$. The other, absolute location, represents a unique detection in each revolution sensing an origin for counting the angle off by means of the incremental detection. This solution is easy to put into operation but required two distinct sensors, which has an unfavorable effect on the cost.

A solution has been described in principle which utilizes only a single sensor. It suffices to eliminate one of the notches for the incremental detection at the place for absolute location. It is then no longer necessary to have two sensors.

However the electronic process of restitution of the reference location is complicated and the angular location signal exhibits a discontinuity.

SUMMARY OF THE INVENTION

Briefly the method aspect of this invention comprises locating a position sensor next to a disk integral with the part driven in rotation whose angular position is to be detected, the disk provided on its periphery with a succession of mechanically identical teeth and notches and having one tooth removed to constitute an absolute reference, the position sensor to detect the passage of the teeth and notches; operating a pulse generator at a frequency F; accumulating in a counter-store the pulses of frequency F as long as the position sensor is next to a tooth; resetting the counter-store to zero each time the position sensor detects the passage from a notch to a tooth; emptying the counter-store at the frequency F/2 as soon as the position sensor detects the passage from a tooth to a notch; detecting the natural passage of the counter-store through the value zero, this instant corresponding to the falling edge of the absent tooth; and modifying at said instant the state of a flip-flop.

The apparatus of the subject invention comprises a position sensor located next to the disk to detect the passage of the teeth and notches; a counter-store; a pulse generator operating at a frequency F, the counter-store accumulating the pulses of frequency F as long as the position sensor is next to a tooth; and a monostable multivibrator sensitive to the falling edge of the input signal; the position sensor being connected to a zero-reset input of the counter-store by the intermediacy of a series connection of the Schmitt trigger and the monostable multivibrator, and the counter-store being connected at an up-down counting input thereof to the output of the Schmitt trigger.

The method of the invention utilizes a digital technique, and thus is particularly adapted to use in large scale integrated circuits. This decoding likewise permits reconstituting the angular location signal with an extremely small error.

One of the principal applications of the method and apparatus of the present invention is the detection of motor position for electronic ignition. Another application is the location of the angular position of a shaft in digital control of a machine tool.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
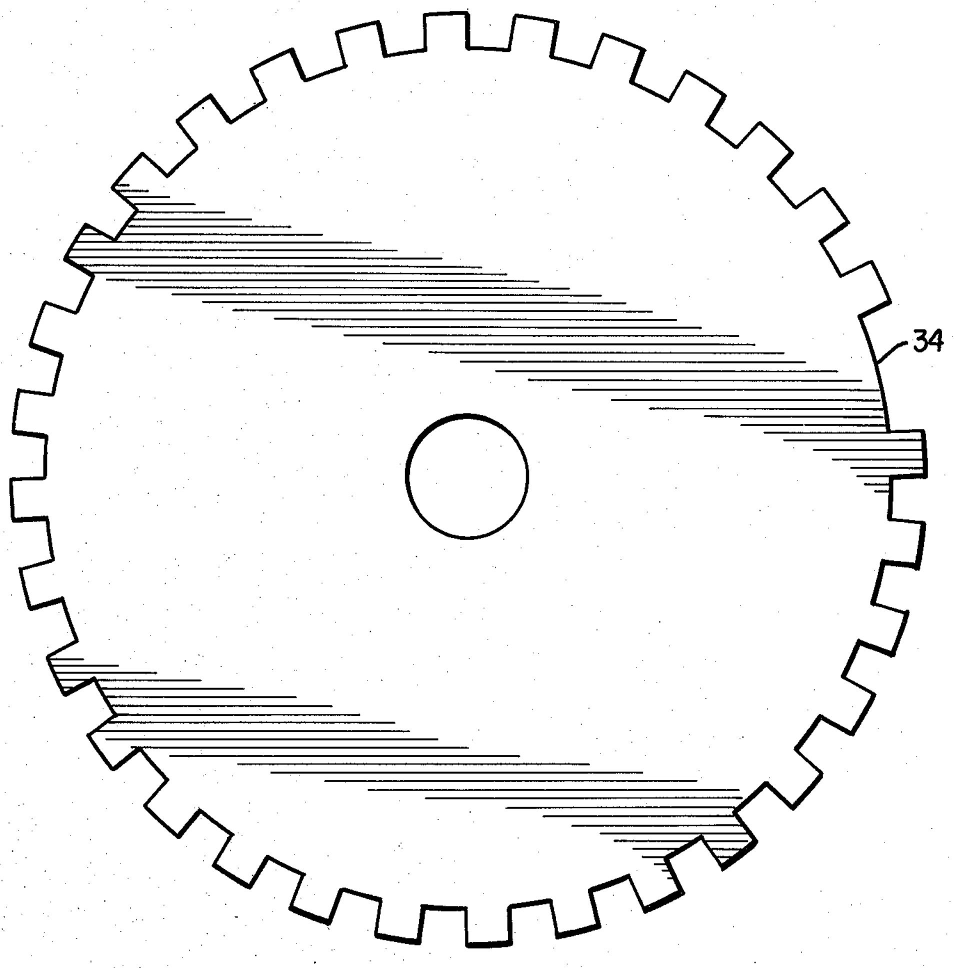
FIG. 1 illustrates the reference disk mounted on the shaft the position of which is to be detected.
Figure 2A:
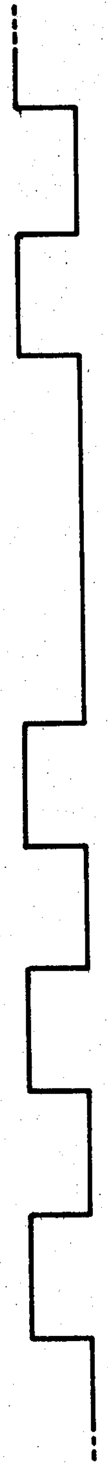
FIG. 2 is a timing diagram of one embodiment of the invention illustrated in FIG. 3.
Figure 2B:
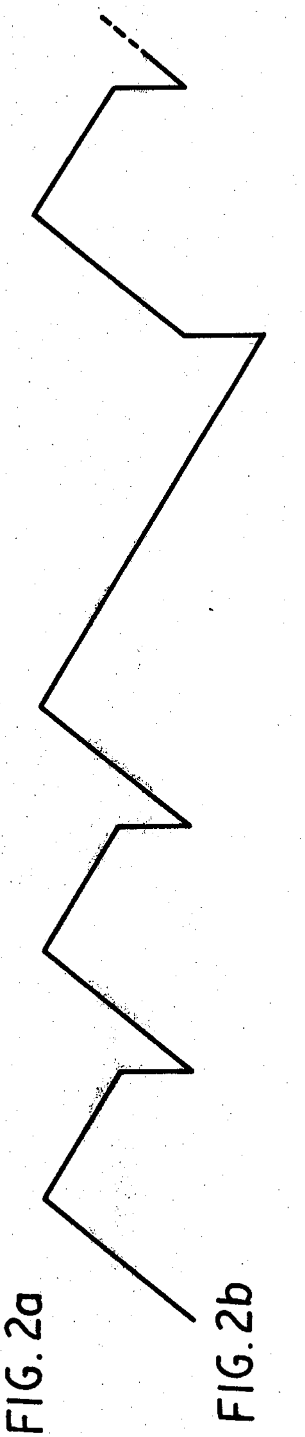
Figure 2C:
Figure 2D:

Referring now to the drawings, wherein like reference numerals designate identical or corresponding parts throughout the several views, and more particularly to FIG. 1 thereof, the method of the invention will be seen to be characterized by the utilization of variable speed up-down counting. FIG. 1 shows the disk carrying the reference points, i.e. a series of teeth, one of them having been removed at the place for the absolute angular reference. The tops of the teeth correspond to a high logic state, the bottoms of the intervening notches to a low logic state. Because of the speed of rotation of the disk, each high period and each low period represent an equal time if the teeth and notches are mechanically identical. A counter-store is reset to zero at each rising front corresponding to the transition from a notch to a tooth. It is then "filled" with the pulses emitted by a clock of frequency F.

On going from a tooth to a notch (falling front) the counter-store is "emptied" (down-counting operation) with pulses emitted at the frequency F/2. If the content of the counter is equal to zero before the appearance of the following notch-to-tooth rising front, this means that the missing tooth has been detected. In the contrary case the cycle is repeated. This method, as indicated above, offers several advantages. On the one hand, it is realizable entirely with the help of digital circuits as will be discussed below with reference to a description of a preferred embodiment of the apparatus of the invention. For this reason, it is easily possible to include it in a VLSI integrated circuit, which reduces its effect on the overall cost. On the other hand, this same technique permits avoiding limitations in the operating dynamics of the circuit. In effect, the speed of rotation of the shaft, the position of which is being detected, can be very low if the capacity of the counter-store is very great. In addition, a high frequency of "filling" the counter can permit high speeds of rotation. But it is important to note that the principle of operation permits considering the two limits in speed in the same terms, thus entailing no limitation. Finally, when the speed of rotation varies, the time difference between the "tooth" period and the "notch" period is not zero. This phenomenon is not troublesome for the method which accepts very high derivatives of the speed.

It is also possible with the basic system of the invention to reconstitute the basic incremental signal, in considering the instants when the counter, down-counting at frequency F/2, reassumes the value it had at the falling front (tooth-to-notch transition). This instant represents the transition notch-to-tooth which has been eliminated to produce the absolute reference. In the same way, the transition tooth-to-notch is represented by the passage to zero of the said counter, when it occurs.

One embodiment of the apparatus for carrying out the method of the invention will now be described with reference to the drawing. The shaft, the angular position of which is to be detected, is equipped at one of its ends with a notched disk, as shown in FIG. 1, having N symmetric teeth regularly spaced around its periphery. At the place corresponding to a special position, a tooth has been removed in order to establish a reference.

Figure 3:
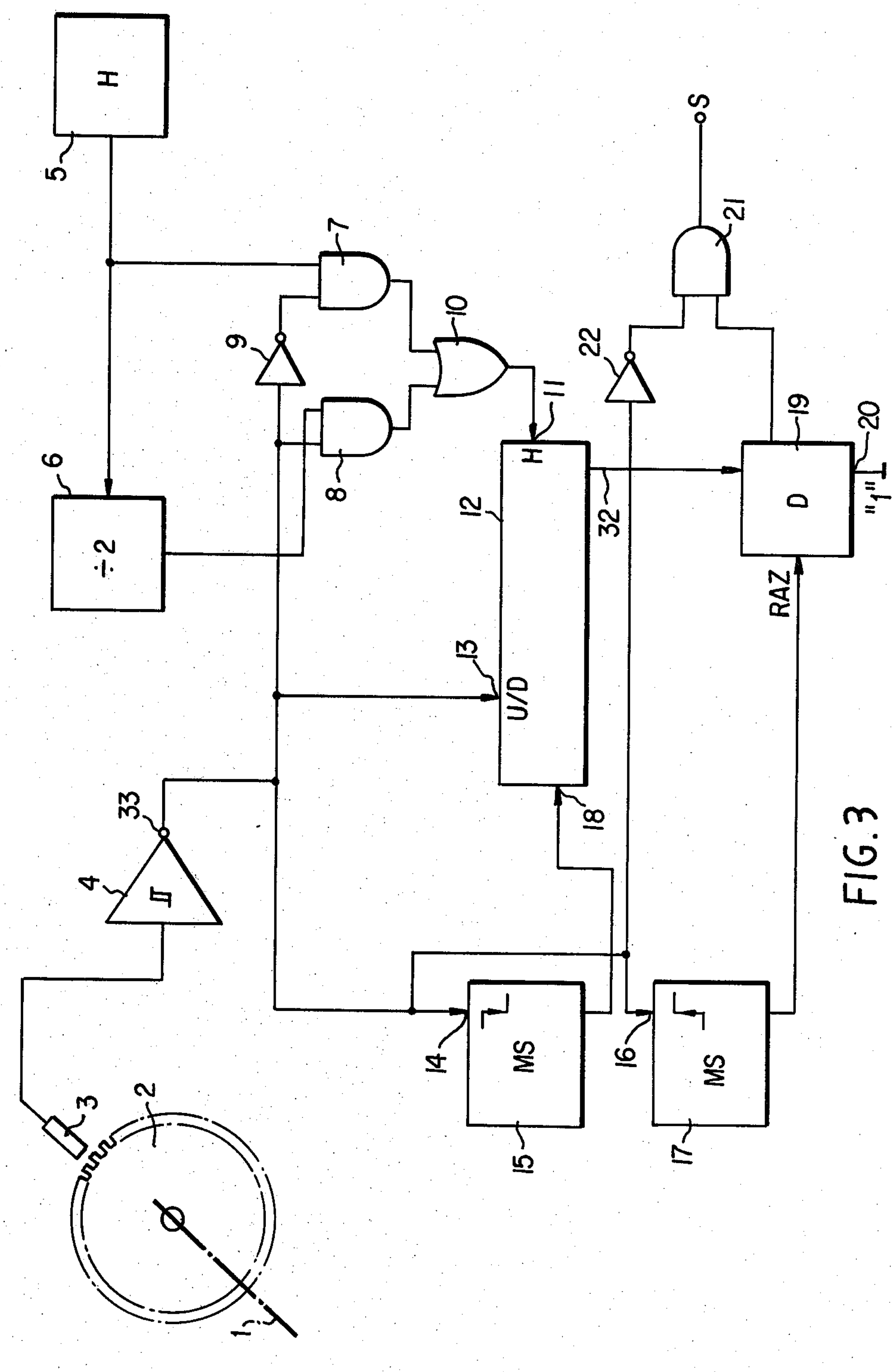
FIG. 3 represents one embodiment of the apparatus of the invention.

The circuitry illustrated in FIG. 3 is intended to isolate this reference. The shaft 1 (FIG. 2) thus has a disk 2 identical to the disk of FIG. 1. A position sensor 3 next to it detects the passage of the teeth. This sensor can be of any commercial type: opto-electronic, magnetic, Hall effect. A Schmitt trigger 4 receives at its input the sensor signal and generates at its output a signal shaped and inverted by an inverter 33.

A clock 5 furnishes at its output a pulse train of frequency F applied, on the one hand, to the input of a divide-by-2 flip-flop 6 and, on the other, to the input of an AND gate 7 with two inputs. The output signal of the flip-flop 6, of frequency F/2, is applied to an input of another two-input AND gate 8. The second input of this gate 8 is connected to the output of the logic inverter 33 tied to the output of the Schmitt trigger 4 and the second input of the AND gate 7 is connected to the output of the logic inverter 9, the input of which receives the signal from the inverter 33 situated at the output of the Schmitt trigger 4. The outputs of the AND gates 7 and 8 are connected to the inputs of an OR gate 10, the output of which is connected to the clock input 11 of an up-down counter 12. The up-down counter 12 receives at its input 13 for control of up-down counting the output signal from the inverter 33 connected to the output of the Schmitt trigger 4. The output signal from the inverter 33 is also applied to the trigger input 14 of a first monostable multivibrator 15 and, to the trigger input 16 of a second monostable 17. The input 14 of the first monostable 15 is sensitive to the falling edge of the input signal and the input 16 of the second monostable 17 is sensitive to the rising edge of the same signal. The output of the monostable 15 is tied to the zero-reset input 18 of the up-down counter 12. The held output 32 of up-down counter 12 is applied to the clock input of a type D flip-flop 19, the input 20 of which is connected via the supply to the logic state ONE. The zero-reset input of this flip-flop 19 is tied to the output of the monostable 17. The output of the flip-flop 19 is connected to one of the inputs of an AND gate 21, the other input being connected to the output of the inverter 33 driven by the Schmitt trigger 4 by the intermediacy of an inverter 22. The output of this gate 21 constitutes in fact the output signal of the overall system.

The apparatus functions according to the principle described above. When the disk 2 presents a tooth to the sensor 3, the output of the flip-flop 4 goes to zero. As a result the monostable 15 generates a zero-reset pulse for the up-down counter 12, the control signal 13 of this up-down counter is set for counting and the clock input 11 by the action of gates 7, 8, 9 and 10 is connected directly to the clock-pulse generator 5. The counter accumulates the pulses during the entire time the tooth is present.

At the moment of tooth-to-notch transistion, the output of the Schmitt trigger 4 flips, thus starting down-counting of the up-down counter 12, at the frequency F/2, by the action of gates 7 to 10. Two solutions are then possible. The first corresponds to the case where the following tooth is present (position different from that corresponding to the reference one). Then the zero-reset pulse produced at the output of the monostable 17 occurs before the type D flip-flop 19 has been set to 1 by the signal resulting from the passage to zero of the counter 12. The flip-flop 19 having never been excited, the signal at S always remains at zero. This solution corresponds (FIG. 2) to the start of each timing diagram. In the second case, the absence of the zero-reset signal due to the absence of a tooth allows the counter 12 to count down to zero. A signal then appears at the output 32 of the said counter and the type D flip-flop 19 is set to one (Signal 2*c*, FIG. 2). When the following tooth appears, the output signal to the gate 21 becomes one until the monostable 17 resets flip-flop 19 to zero. The operation of the system is then repeated in an identical manner to the preceding.

The timing diagram of FIG. 2 represents on the first line the form of the signal 2*a* at the output of the Schmitt trigger 4; on the second line 2*b* the course of the counting and down-counting inside the counter 12; on the third line the form of the signal 2*c* at the output of the type D flip-flop 19 and on the fourth line the form of the signal 2*d* at S from the output of the AND logic gate 21.

Figure 4:
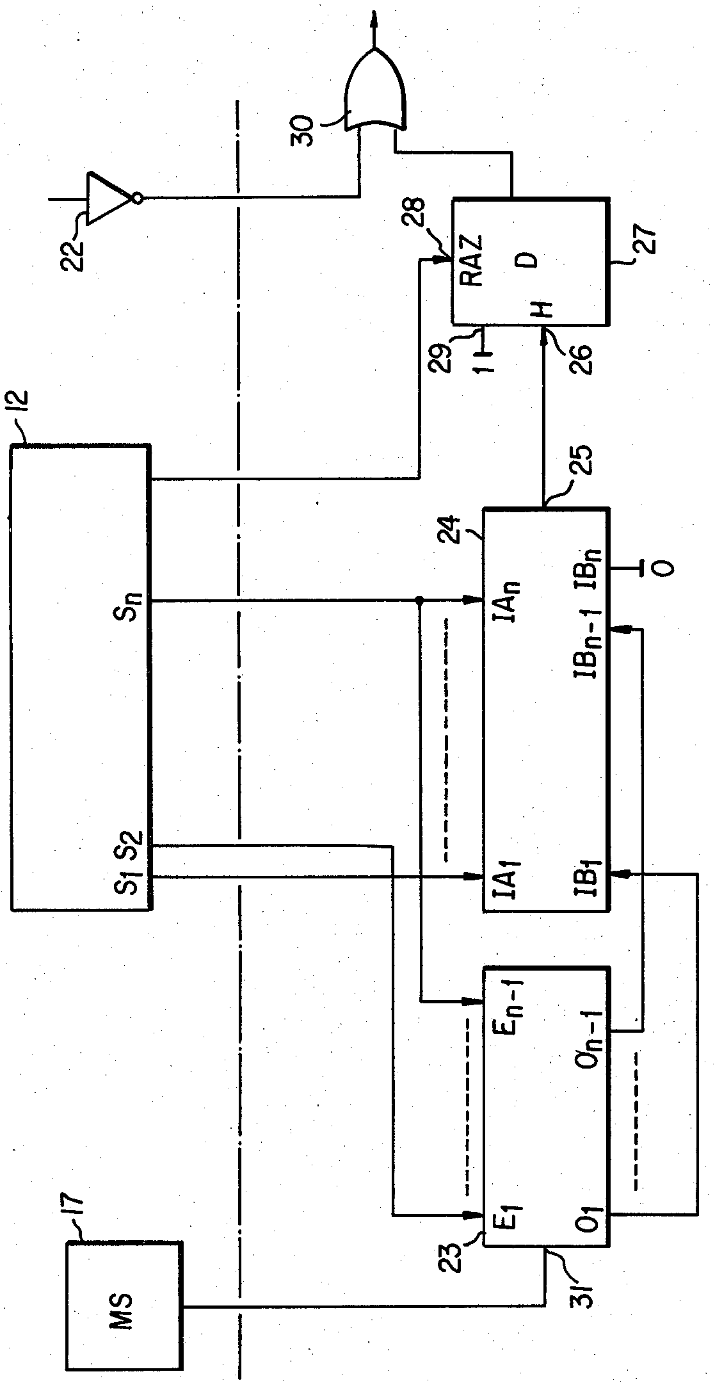
FIG. 4 shows a circuit for complementary reconstitution of the incremented signal.

FIG. 4 shows the circuit permitting reconstitution of the complete incremental signal mentioned at the beginning of the specification. The up-down counter 12 of the basic system possesses n outputs (as many as there are elementary flip-flop stages) $S_1$ to $S_n$.

A memory 23 of n-1 cells is connected in the following manner: its input $E_1$ is tied to the output $S_2$ of up-down counter 12, its input $E_2$ is tied to the output $S_3$ and so on to its input $E_{n-1}$ which is tied to the output $S_n$ of the counter. The memory 23 is connected via its outputs to the inputs B of a logic comparator 24 of n bits: the output $O_1$ of memory 23 is tied to the input $IB_1$ of comparator 24, the output $O_2$ is tied to the input $IB_2$ and so on to the output $O_{n-1}$ of the memory 23 which is tied to the input $IB_{n-1}$ of the comparator. The input $IB_n$ of this same comparator is set to logic zero by the wiring. The inputs $IA_o$ to $IA_n$ of comparator 24 are tied to the outputs $S_o$ to $S_n$, respectively, of the up-down counter 12.

The output 25 of comparator 24, which indicates the coincidence of numbers placed on IA and IB, is connected to the clock input 26 of a type D flip-flop 27. This same flip-flop has its zero-reset input 28 tied to the "held" output of the up-down counter 12 and its input 29 set to logic "one". Its output is applied to one of the inputs of an OR gate 30 the second input of which receives the output signal of the inverter 22 of the basic arrangement. The output of this OR gate 30 represents the reconstituted incremental signal.

The input 31 of the memory 23 is tied to the output of the monostable 17 in the basic circuit.

The operation of this circuit is simple and is better understood in connection with the timing diagrams of FIG. 5. It is assumed that the sensor is opposite the last tooth before the reference location 34 of the missing tooth.

Figure 5A:
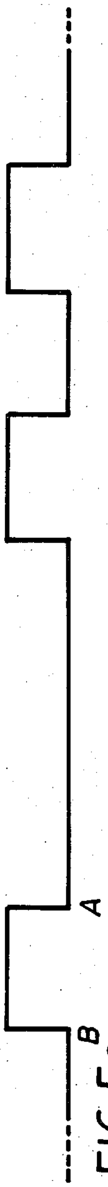
FIG. 5 is a timing diagram of the signals of the circuit of FIG. 4.
Figure 5B:
Figure 5C:
Figure 5D:
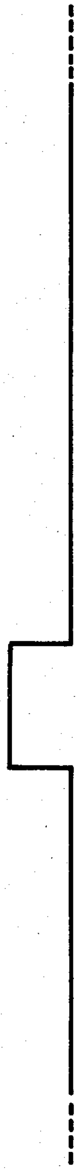
Figure 5E:

At the falling edge of this tooth the monostable 17 generates a pulse which puts into memory the number of pulses present in the up-down counter 12. The latter has counted at the frequency F during the entire time of the passage of the tooth and the number obtained at the instant of the said write pulse is N. In fact, the number actually written into the memory 23 is N/2 since the set of outputs is shifted one place to the left. The next phase is the down-counting at the frequency F/2. When the counter 12 reaches the value N/2, the comparator 24 produces a pulse at its output 24, FIG. 5*b*, a pulse that gives rise to a "one" at the output of the flip-flop 27. In fact, this instant, defined by the counting of N/2 pulses at the frequency F/2 after the falling edge of the tooth (point A in FIG. 5*a*), is the symmetric one of point B with respect to this point A. It thus corresponds to the rising edge of the absent tooth. The signal of passage to zero put out by the counter 12, FIG. 5*c*, which corresponds to the counting of N pulses starting at A at the frequency F/2 represents the falling edge of the missing tooth and resets the type D flip-flop 27 to zero, the form of the output signal of which is shown in FIG. 5*d*. Finally, the OR gate 30 permits, by the mixing of the incident signal (FIG. 5*a*) and the flip-flop signal, obtaining the reconstituted incremental signal (FIG. 5*e*).

The error committed in the restitution of this missing tooth is very small since it is limited to the angular deviation between the tooth and the notch created by the acceleration of the moving system. The number of notches being high, the variation in speed during this time is extremely small and consequently the error is small also.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method of detecting the angular position of a part driven in rotation, integral with a disk provided on its periphery with a succession of mechanically identical teeth and notches and having one tooth removed to constitute an absolute reference, comprising the steps of:

locating a position sensor next to the periphery of the disk to detect the passage of the teeth and notches;

opertating a pulse generator at a frequency F;

resetting a counter-store to zero each time the position sensor detects the passage from a notch to a tooth;

accumulating in the counter-store the pulses of frequency F when a tooth is passing the position sensor;

emptying the counter-store at the frequency F/2 when a notch is passing the position sensor;

detecting the natural passage of the counter-store through the value zero, this instant corresponding to the falling edge of the absent tooth; and modifying at said instant the state of a flip-flop.

2. The method of detecting the angular position of a part driven in rotation recited in claim 1 including the steps of:

writing into a memory half of the number contained in the counter-store at the moment of the last passage tooth-to-notch preceding the reference position of the missing tooth;

continuing to empty the counter-store at the frequency F/2;

comparing in a comparator means the content of the counter-store with the number in the memory, said comparator means producing an output signal when the content of said counter-store is equal to the number in said memory; and detecting successively the output of the comparator means and the zero of the counter-store whereby reconstitution of the passage of the missing tooth is permitted.

3. An apparatus for decoding the angular position of a part driven in rotation integral with a disk provided on its periphery with a succession of mechanically identical teeth and notches and having one tooth removed to constitute an absolute reference, comprising:

position sensor means adapted to be located next to the periphery of the disk for detecting the passage of the teeth and notches;

a counter-store;

pulse generator means for producing a first group of pulse signals at a frequency F and a second group of pulse signals at a frequency of ½ F (F/2), the counter-store accumulating pulses at frequency F as long as the position sensor detects a tooth and being emptied at the frequency F/2 as long as the position sensor detects a notch;

a Schmitt trigger; and a first monostable multivibrator sensitive to the transition from a notch to a tooth of the input signal;

the position sensor means being connected to a zero-reset input of a counter-store by the intermediacy of a series connection of the Schmitt trigger and the monostable multivibrator, and the counter-store being connected at an up-down counting input thereof to the output of the Schmitt trigger.

4. The apparatus for decoding the angular position of a part driven in rotation recited in claim 3, including a clock pulse generator of frequency F and a plurality of logic circuits; and wherein a clock input of the counter-store is connected, on one hand, to the output of the clock pulse generator of frequency F, and on the other hand, to the output of the Schmitt trigger by the intermediacy of the logic circuits.

5. The apparatus for decoding the angular position of a part driven in rotation recited in claim 4, including a flip-flop forming a divide-by-2; and wherein the clock input of the counter-store is connected, in addition, by the intermediacy of the logic circuits to the output of the flip-flop forming a divide-by-2, the flip-flop being connected by its input to an output of the clock pulse generator.

6. The apparatus for decoding the angular position of a part driven in rotation recited in claim 5, including:

a type D flip-flop, the input of which is maintained at a high logic level;

a second multivibrator sensitive to the transition from a tooth to a notch of the received signal, said multivibrator being coupled between said Schmitt trigger and the zero-reset of said typed flip-flop; and a held output of the counter-store being connected to the clock input of the type D flip-flop.

7. The apparatus for decoding the angular position of a part driven in rotation recited in claim 5, including:

an AND logic gate having two inputs, one input of the AND logic gate being connected to the output of the type D flip-flop and the second input of the AND logic gate being connected to the output of the Schmitt trigger.

8. The apparatus for decoding the angular position of a part driven in roatation recited in claim 5, including:

a memory having (n−1) cells and disposed between the output of the monostable multibrator sensitive to the rising front of the received signal and the zero-reset input of the type D flip-flop; and a logic comparator of n binary digit capacity connected by the first (n−1) of one of its sets of inputs to the (n−1) outputs of the memory in order and by its second set of inputs to the n outputs of the counter-store, the inputs from 1 to (n−1) of the memory being connected to the outputs 2 to n of the counter-store that is, with a shift of one place.

9. An apparatus for decoding the angular position of a part driven in rotation integral with a disk provided on its periphery with a succession of mechanically identical teeth and notches and having one tooth removed to constitute an absolute reference, comprising:

position sensor means adapted to be located next to the periphery of said disk for detecting the passage of said teeth and notches;

Schmitt trigger means coupled to said position sensor for pulse shaping the output of said position sensor, and for producing an output representing the passage of said teeth and notches;

pulse generator means for producing a first group of pulse signals at a frequency F and a second group of pulse signals at a frequency of ½ F;

counter-store means coupled to said Schmitt trigger means and to said pulse generator means for accumulating pulses at frequency F as long as said position sensor means detects the passage of a tooth, for emptying said counter-store means at the frequency ½ F as long as said position sensor means detects a notch, and for producing an output when the contents of said counter-store means is zero, said output representing the passage of said missing tooth; and monostable multivibrator means coupled to said Schmitt trigger means for detecting the transistor from a notch to a tooth, and for generating a zero-reset signal for said counter-store means upon the detection of said transition.

* * * * *